US011657878B2

(12) United States Patent
Pollio et al.

(10) Patent No.: US 11,657,878 B2
(45) Date of Patent: May 23, 2023

(54) INITIALIZATION TECHNIQUES FOR MEMORY DEVICES

(71) Applicant: Micron Technology, Inc., Boise, ID (US)

(72) Inventors: Antonino Pollio, Vico Equense (IT); Giuseppe Vito Portacci, Vimercate (IT); Mauro Luigi Sali, Sant'Angelo Lodigiano (IT); Alessandro Magnavacca, Sesto San Giovanni (IT)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/586,526

(22) Filed: Jan. 27, 2022

(65) Prior Publication Data
US 2022/0223211 A1 Jul. 14, 2022

Related U.S. Application Data

(63) Continuation of application No. 16/952,880, filed on Nov. 19, 2020, now Pat. No. 11,238,940.

(51) Int. Cl.
*G11C 16/20* (2006.01)
*G11C 16/16* (2006.01)
(Continued)

(52) U.S. Cl.
CPC .............. *G11C 16/20* (2013.01); *G11C 16/16* (2013.01); *G11C 16/26* (2013.01); *G11C 29/14* (2013.01); *G11C 29/42* (2013.01)

(58) Field of Classification Search
CPC ........... G11C 16/20; G11C 16/16; G11C 6/26; G11C 29/14
See application file for complete search history.

(56) References Cited

U.S. PATENT DOCUMENTS

| 7,234,047 B1 | 6/2007 | Mahmoud |
| 8,656,089 B2 | 2/2014 | Hsu et al. |

(Continued)

FOREIGN PATENT DOCUMENTS

| CN | 109388595 A | 2/2019 |
| CN | 111383679 A | 7/2020 |

OTHER PUBLICATIONS

Chinese Patent Office, "Office Action and Search Report", issued in connection with Chinese Patent Application No. 202111375504.8 dated Aug. 15, 2022 (9 pages).

*Primary Examiner* — Han Yang
(74) *Attorney, Agent, or Firm* — Holland & Hart LLP (57) ABSTRACT

Methods, systems, and devices for initialization techniques for memory devices are described. A memory system may include a memory array on a first die and a controller on a second die, where the second die is coupled with the first die. The controller may perform an initialization procedure based on operating instructions stored within the memory system. For example, the controller may read a first set of operating instructions from read-only memory on the second die. The controller may obtain a second set of operating instructions stored at a memory block of the memory array on the first die, with the memory block indicated by the first set of operating instructions. The controller may complete or at least further the initialization procedure based on the second set of operating instructions.

20 Claims, 5 Drawing Sheets

(51) Int. Cl.
*G11C 29/42* (2006.01)
*G11C 29/14* (2006.01)
*G11C 16/26* (2006.01)

(56) References Cited

U.S. PATENT DOCUMENTS

| | | |
|---|---|---|
| 2004/0255111 A1 | 12/2004 | Lim |
| 2007/0153585 A1 | 7/2007 | Blum |
| 2007/0180186 A1* | 8/2007 | Cornwell .............. G06F 12/023 |
| | | 711/170 |
| 2019/0050325 A1 | 2/2019 | Malladi et al. |
| 2020/0210107 A1 | 7/2020 | Palmer |

* cited by examiner

INITIALIZATION TECHNIQUES FOR MEMORY DEVICES

CROSS REFERENCE

The present application for patent is a continuation of U.S. patent application Ser. No. 16/952,880 by Pollio et al., entitled "INITIALIZATION TECHNIQUES FOR MEMORY DEVICES" filed Nov. 19, 2020, assigned to the assignee hereof, and is expressly incorporated by reference in its entirety herein.

FIELD OF TECHNOLOGY

The following relates generally to one or more systems for memory and more specifically to initialization techniques for memory devices.

BACKGROUND

Memory devices are widely used to store information in various electronic devices such as computers, wireless communication devices, cameras, digital displays, and the like. Information is stored by programing memory cells within a memory device to various states. For example, binary memory cells may be programmed to one of two supported states, often corresponding to a logic 1 or a logic 0. In some examples, a single memory cell may support more than two possible states, any one of which may be stored by the memory cell. To access information stored by a memory device, a component may read, or sense, the state of one or more memory cells within the memory device. To store information, a component may write, or program, one or more memory cells within the memory device to corresponding states.

Various types of memory devices exist, including magnetic hard disks, random access memory (RAM), read-only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), 3-dimensional cross-point memory (3D cross point), not- or (NOR), and not- and (NAND) memory devices, and others. Memory devices may be volatile or non-volatile. Volatile memory cells (e.g., DRAM cells) may lose their programmed states over time unless they are periodically refreshed by an external power source. Non-volatile memory cells (e.g., NAND memory cells) may maintain their programmed states for extended periods of time even in the absence of an external power source.

DETAILED DESCRIPTION

A memory system may include one or more memory devices, such as NOT-AND (NAND) memory devices. For example, the memory system may be an example of a managed NAND (MNAND) system coupled to a host device. The memory system may include a memory system controller that manages operations for the one or more memory devices (e.g., an MNAND controller) in addition or alternative to local controllers associated with respective memory devices. In some cases, the NAND devices may each be on a respective die, with the respective die for a NAND device also including the local controller for the NAND device, and the MNAND controller may be on one or more dies separate from the NAND device dies.

The memory system controller may perform an initialization procedure (e.g., to initialize the memory system controller), for example, upon a startup of the memory system. The memory system controller may perform the initialization procedure based on operating instructions (e.g., bootstrap code) from read-only memory (ROM) associated with (e.g., on a same die as) the memory system controller. The ROM may in some cases be conceptualized as part of the memory system controller, but the teachings herein are not dependent on such conceptualizations. In some cases, the operating instructions may be encoded to the ROM during fabrication of the memory system (e.g., the ROM may be hardwired to store the operating instructions for the memory system controller based on one or more fabrication masks used during a fabrication process for the die that includes the ROM and memory system controller, such as masks for one or more metal layers of the die). Accordingly, altering the contents of the ROM associated with the memory system controller may be relatively challenging. For example, one or more fabrication masks or other aspects of a fabrication process for the die that includes the ROM may need to be altered in order to alter the contents of the ROM.

In accordance with the techniques described herein, a memory system may implement enhanced initialization techniques, which may result in improved efficiency for error correction or modification of operating instructions for a memory system controller, including instructions used to initialize the memory system controller, which may be referred to as bootstrap code or instructions, among other advantages. For example, a first set of operating instructions for an initialization procedure for the memory system controller may be stored in ROM associated with the memory system controller (e.g., ROM on the same die as the memory system controller may be encoded with (e.g., fabricated so as to store) the first set of operating instructions). Additionally, a second (e.g., remaining) set of operating instructions for the initialization procedure may be stored in one or more memory blocks of a memory array within a memory device coupled to the memory system controller (e.g., one or more memory blocks of a memory array on a second die, such as one or more NAND blocks, which may be one-time programmable (OTP) blocks). The first set of operating instructions may indicate a location of the second set of operating instructions (e.g., what memory block(s) of the memory array on the second die store the second set of operating instructions) and the memory system may obtain the second set of operating instructions from the memory device based on the indicated location. Thus, for example, a first portion of boostrap code for the memory system controller may be stored in on-die ROM for the memory system controller, and a second portion of the boostrap code may be stored in one or more blocks of a memory array (e.g., a NAND array) on a second die, with the first portion of the boostrap code indicating the second portion of the boostrap code. Thus, at least the second portion of the boostrap code may be modified more easily than were like instructions included in the on-die ROM for the memory system controller.

In some examples, the memory block(s) that store the second set of operating instructions (e.g., second portion of the boostrap code) may be configured to be inaccessible to a host device coupled to the memory system. In some examples, the memory block(s) of the memory array may be configured to be programmable (e.g., reprogrammable) when the memory system is configured in a test mode and read-only when the memory system is not configured in the test mode.

The memory system may perform error correction or detection for the second set of operating instructions. For example, the memory array may include multiple copies of the second set of operating instructions. The memory system (e.g., a local memory controller included on the same die as the memory array) may read the multiple copies and verify that at least a subset of the multiple copies (e.g., a majority of the copies) are identical copies and transfer one of the identical copies to the controller. Additionally or alternatively, the memory system controller may use error information to detect or correct errors in the second set of operating instructions. For example, the memory system controller may read the second set of operating instructions (e.g., including associated parity information) and detect and/or correct an error in the second set of operating instructions using the parity information.

Such techniques may result in enhanced flexibility for modification of operating instructions for initialization the memory system controller. For example, errors of the instructions may be corrected or updates to the instructions otherwise implemented based on reprogramming gone or more blocks of a memory array, rather than altering one or more fabrication processes associated with a die that includes the memory system controller. Such techniques may also support improved efficiency for various operations as described herein, among other benefits.

Features of the disclosure are initially described in the context of systems and block diagrams as described with reference to FIGS. 1 and 2. These and other features of the disclosure are further illustrated by and described with reference to an apparatus diagram and flowcharts that relate to initialization techniques for memory devices as described with reference to FIGS. 3-5.

Figure 1:
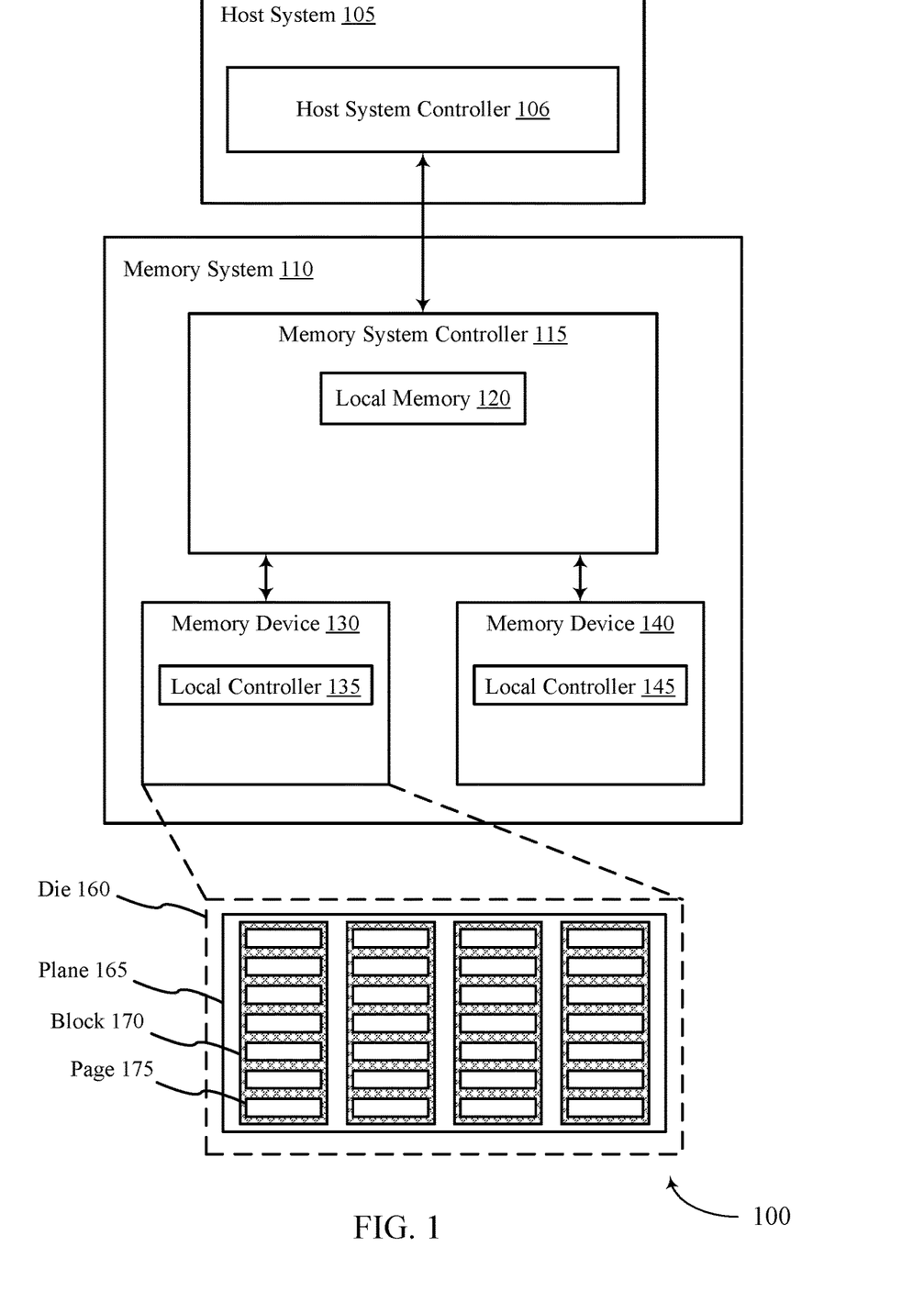
FIG. 1 illustrates an example of a system that supports initialization techniques for memory devices in accordance with examples as disclosed herein.

FIG. 1 is an example of a system 100 that supports initialization techniques for memory devices in accordance with examples as disclosed herein. The system 100 includes a host system 105 coupled with a memory system 110.

A memory system 110 may be or include any device or collection of devices, where the device or collection of devices includes at least one memory array. For example, a memory system 110 may be or include a Universal Flash Storage (UFS) device, an embedded Multi-Media Controller (eMMC) device, a flash device, a universal serial bus (USB) flash device, a secure digital (SD) card, a solid-state drive (SSD), a hard disk drive (HDD), a dual in-line memory module (DIMM), a small outline DIMM (SO-DIMM), or a non-volatile DIMM (NVDIMM), among other possibilities.

The system 100 may be included in a computing device such as a desktop computer, a laptop computer, a network server, a mobile device, a vehicle (e.g., airplane, drone, train, automobile, or other conveyance), an Internet of Things (IoT) enabled device, an embedded computer (e.g., one included in a vehicle, industrial equipment, or a networked commercial device), or any computing device that includes memory and a processing device.

The system 100 may include a host system 105, which may be coupled with the memory system 110. In some examples, this coupling may include an interface with a host system controller 106, which may be an example of a control component configured to cause the host system 105 to perform various operations in accordance with examples as described herein. The host system 105 may include one or more devices, and in some cases may include a processor chipset and a software stack executed by the processor chipset. For example, the host system 105 may include an application configured for communicating with the memory system 110 or a device therein. The processor chipset may include one or more cores, one or more caches (e.g., memory local to or included in the host system 105), a memory controller (e.g., NVDIMM controller), and a storage protocol controller (e.g., PCIe controller, serial advanced technology attachment (SATA) controller). The host system 105 may use the memory system 110, for example, to write data to the memory system 110 and read data from the memory system 110. Although one memory system 110 is shown in FIG. 1, it is to be understood that the host system 105 may be coupled with any quantity of memory systems 110.

The host system 105 may be coupled with the memory system 110 via at least one physical host interface. The host system 105 and the memory system 110 may in some cases be configured to communicate via a physical host interface using an associated protocol (e.g., to exchange or otherwise communicate control, address, data, and other signals between the memory system 110 and the host system 105). Examples of a physical host interface may include, but are not limited to, a SATA interface, a UFS interface, an eMMC interface, a peripheral component interconnect express (PCIe) interface, USB interface, Fiber Channel, Small Computer System Interface (SCSI), Serial Attached SCSI (SAS), Double Data Rate (DDR), a dual in-line memory module (DIMM) interface (e.g., DIMM socket interface that supports DDR), Open NAND Flash Interface (ONFI), Low Power Double Data Rate (LPDDR). In some examples, one or more such interfaces may be included in or otherwise supported between a host system controller 106 of the host system 105 and a memory system controller 115 of the memory system 110. In some examples, the host system 105 may be coupled with the memory system 110 (e.g., the host system controller 106 may be coupled with the memory system controller 115) via a respective physical host interface for each memory device 130 or memory device 140 included in the memory system 110, or via a respective physical host interface for each type of memory device 130 or memory device 140 included in the memory system 110.

Memory system 110 may include a memory system controller 115, a memory device 130, and a memory device 140. A memory device 130 may include one or more memory arrays of a first type of memory cells (e.g., a type of non-volatile memory cells), and a memory device 140 may include one or more memory arrays of a second type of memory cells (e.g., a type of volatile memory cells). Although one memory device 130 and one memory device 140 are shown in the example of FIG. 1, it is to be understood that memory system 110 may include any quantity of memory devices 130 and memory devices 140, and that, in some cases, memory system 110 may lack either a memory device 130 or a memory device 140.

The memory system controller 115 may be coupled with and communicate with the host system 105 (e.g., via the physical host interface), and may be an example of a control component configured to cause the memory system 110 to perform various operations in accordance with examples as described herein. The memory system controller 115 may also be coupled with and communicate with memory devices 130 or memory devices 140 to perform operations such as reading data, writing data, erasing data, or refreshing data at a memory device 130 or a memory device 140, and other such operations, which may generically be referred to as access operations. In some cases, the memory system controller 115 may receive commands from the host system 105 and communicate with one or more memory devices 130 or memory devices 140 to execute such commands (e.g., at memory arrays within the one or more memory devices 130 or memory devices 140). For example, the memory system controller 115 may receive commands or operations from the host system 105 and may convert the commands or operations into instructions or appropriate commands to achieve the desired access of the memory devices 130 or memory devices 140. And in some cases, the memory system controller 115 may exchange data with the host system 105 and with one or more memory devices 130 or memory devices 140 (e.g., in response to or otherwise in association with commands from the host system 105). For example, the memory system controller 115 may convert responses (e.g., data packets or other signals) associated with the memory devices 130 or memory devices 140 into corresponding signals for the host system 105.

The memory system controller 115 may be configured for other operations associated with the memory devices 130 or memory devices 140. For example, the memory system controller 115 may execute or manage operations such as wear-leveling operations, garbage collection operations, error control operations such as error-detecting operations or error-correcting operations, encryption operations, caching operations, media management operations, background refresh, health monitoring, and address translations between logical addresses (e.g., logical block addresses (LBAs)) associated with commands from the host system 105 and physical addresses (e.g., physical block addresses) associated with memory cells within the memory devices 130 or memory devices 140.

The memory system controller 115 may include hardware such as one or more integrated circuits or discrete components, a buffer memory, or a combination thereof. The hardware may include circuitry with dedicated (e.g., hard-coded) logic to perform the operations ascribed herein to the memory system controller 115. The memory system controller 115 may be or include a microcontroller, special purpose logic circuitry (e.g., a field programmable gate array (FPGA), an application specific integrated circuit (ASIC), a digital signal processor (DSP)), or any other suitable processor or processing circuitry.

The memory system controller 115 may also include a local memory 120. In some cases, the local memory 120 may include read-only memory (ROM) or other memory that may store operating code (e.g., executable instructions) executable by the memory system controller 115 to perform functions ascribed herein to the memory system controller 115. In some cases, the local memory 120 may additionally or alternatively include static random access memory (SRAM) or other memory that may be used by the memory system controller 115 for internal storage or calculations, for example, related to the functions ascribed herein to the memory system controller 115. Additionally or alternatively, the local memory 120 may serve as a cache for the memory system controller 115. For example, data may be stored to the local memory 120 when read from or written to a memory device 130 or memory device 140, and may be available within the local memory 120 for subsequent retrieval for or manipulation (e.g., updating) by the host system 105 (e.g., with reduced latency relative to a memory device 130 or memory device 140) in accordance with a cache policy.

Although the example of memory system 110 in FIG. 1 has been illustrated as including the memory system controller 115, in some cases, a memory system 110 may not include a memory system controller 115. For example, the memory system 110 may additionally or alternatively rely upon an external controller (e.g., implemented by the host system 105) or one or more local controllers 135 or local controllers 145, which may be internal to memory devices 130 or memory devices 140, respectively, to perform the functions ascribed herein to the memory system controller 115. In general, one or more functions ascribed herein to the memory system controller 115 may in some cases instead be performed by the host system 105, a local controller 135, or a local controller 145, or any combination thereof.

A memory device 140 may include one or more arrays of volatile memory cells. For example, a memory device 140 may include random access memory (RAM) memory cells, such as dynamic RAM (DRAM) memory cells and synchronous DRAM (SDRAM) memory cells. In some examples, a memory device 140 may support random access operations (e.g., by the host system 105) with reduced latency relative to a memory device 130, or may offer one or more other performance differences relative to a memory device 130.

A memory device 130 may include one or more arrays of non-volatile memory cells. For example, a memory device 130 may include NAND (e.g., NAND flash) memory, ROM, phase change memory (PCM), self-selecting memory, other chalcogenide-based memories, ferroelectric RAM (Fe-RAM), magneto RAM (MRAM), NOR (e.g., NOR flash) memory, Spin Transfer Torque (STT)-MRAM, conductive bridging RAM (CBRAM), resistive random access memory (RRAM), oxide based RRAM (OxRAM), and electrically erasable programmable ROM (EEPROM).

In some examples, a memory device 130 or a memory device 140 may include (e.g., on a same die or within a same package) a local controller 135 or a local controller 145, respectively, which may execute operations on one or more memory cells of the memory device 130 or the memory device 140. A local controller 135 or a local controller 145 may operate in conjunction with a memory system controller 115 or may perform one or more functions ascribed herein to the memory system controller 115. In some cases, a memory device 130 or a memory device 140 that includes a local controller 135 or a local controller 145 may be referred to as a managed memory device and may include a memory array and related circuitry combined with a local (e.g., on-die or in-package) controller (e.g., local controller 135 or local controller 145). An example of a managed memory device is a managed NAND (MNAND) device.

In some cases, a memory device 130 may be or include a NAND device (e.g., NAND flash device). A memory device 130 may be or include a memory die 160. For example, in some cases, a memory device 130 may be a package that includes one or more dies 160. A die 160 may, in some examples, be a piece of electronics-grade semiconductor cut from a wafer (e.g., a silicon die cut from a silicon wafer). Each die 160 may include one or more planes 165, and each plane 165 may include a respective set of blocks 170, where each block 170 may include a respective set of pages 175, and each page 175 may include a set of memory cells.

In some cases, a NAND memory device 130 may include memory cells configured to each store one bit of information, which may be referred to as single level cells (SLCs).

Additionally or alternatively, a NAND memory device 130 may include memory cells configured to each store multiple bits of information, which may be referred to as multi-level cells (MLCs) if configured to each store two bits of information, as tri-level cells (TLCs) if configured to each store three bits of information, as quad-level cells (QLCs) if configured to each store four bits of information, or more generically as multiple-level memory cells. Multiple-level memory cells may provide greater density of storage relative to SLC memory cells but may, in some cases, involve narrower read or write margins or greater complexities for supporting circuitry.

In some cases, planes 165 may refer to groups of blocks 170, and in some cases, concurrent operations may take place within different planes 165. For example, concurrent operations may be performed on memory cells within different blocks 170 so long as the different blocks 170 are in different planes 165. In some cases, performing concurrent operations in different planes 165 may be subject to one or more restrictions, such as identical operations being performed on memory cells within different pages 175 that have the same page address within their respective planes 165 (e.g., related to command decoding, page address decoding circuitry, or other circuitry being shared across planes 165).

In some cases, a block 170 may include memory cells organized into rows (pages 175) and columns (e.g., strings, not shown). For example, memory cells in a same page 175 may share (e.g., be coupled with) a common word line, and memory cells in a same string may share (e.g., be coupled with) a common digit line (which may alternatively be referred to as a bit line).

For some NAND architectures, memory cells may be read and programmed (e.g., written) at a first level of granularity (e.g., at the page level of granularity) but may be erased at a second level of granularity (e.g., at the block level of granularity). That is, a page 175 may be the smallest unit of memory (e.g., set of memory cells) that may be independently programmed or read (e.g., programmed or read concurrently as part of a single program or read operation), and a block 170 may be the smallest unit of memory (e.g., set of memory cells) that may be independently erased (e.g., erased concurrently as part of a single erase operation). Further, in some cases, NAND memory cells may be erased before they can be re-written with new data. Thus, for example, a used page 175 may in some cases not be updated until the entire block 170 that includes the page 175 has been erased.

In some cases, to update some data within a block 170 while retaining other data within the block 170, the memory device 130 may copy the data to be retained to a new block 170 and write the updated data to one or more remaining pages of the new block 170. The memory device 130 (e.g., the local controller 135) or the memory system controller 115 may mark or otherwise designate the data that remains in the old block 170 as invalid or obsolete, and update an L2P mapping table to associate the logical address (e.g., LBA) for the data with the new, valid block 170 rather than the old, invalid block 170. In some cases, such copying and remapping may be preferable to erasing and rewriting the entire old block 170, due to latency or wearout considerations, for example. In some cases, one or more copies of an L2P mapping table may be stored within the memory cells of the memory device 130 (e.g., within or more blocks 170 or planes 165) for use (e.g., reference and updating) by the local controller 135 or memory system controller 115.

In some examples, the memory system 110 may be an example of an MNAND device including an MNAND controller (e.g., the memory system controller 115) that manages operations for one or more memory devices (e.g., memory device 130 or memory device 140) in addition or alternative to local controllers (e.g., local controller 135 or local controller 145). The memory system controller 115 may perform an initialization procedure, for example, upon a startup of the memory system 110. The memory system controller 115 may read operating instructions from ROM associated with the memory system controller 115 (e.g., the local memory 120 may be or include such ROM) as part of the initialization procedure. In some cases, the operating instructions may be encoded to the ROM associated with the memory system controller 115 during fabrication of the memory system 110 (e.g., the ROM coupled with the memory system controller 115 may be hardwired based on or more masks used during a fabrication process, such as one or more masks used to form one or more metallization layers of the ROM).

In accordance with the techniques described herein, the system 100 may implement enhanced ROM techniques, which may result in improved efficiency for modification of operating instructions for the memory system controller 115, among other advantages. For example, a first set of operating instructions for an initialization procedure may be stored in ROM associated with the memory system controller 115 (e.g., ROM of the memory system controller 115 may be encoded with the first set of operating instructions). Additionally, a second set of operating instructions for the initialization procedure may be stored in one or more memory blocks 170 of the memory device 130. For example, the first set of operating instructions may indicate a location of the second set of operating instructions and the memory system controller 115 may obtain the second set of operating instructions from the one or more memory blocks 170 (e.g., one or more OTP memory blocks 170) based on the indicated location. In some examples, the one or more memory blocks 170 may be configured to be inaccessible to the host system 105 coupled to the memory system 110. In some examples, the one or more memory blocks 170 may be configured to be programmable when the memory system 110 is configured in a test mode and read-only when the memory system 110 is not configured in the test mode.

The system 100 may include any quantity of non-transitory computer readable media that support initialization techniques for memory devices. For example, the host system 105, the memory system controller 115, a memory device 130, or a memory device 140 may include or otherwise may access one or more non-transitory computer readable media storing instructions (e.g., firmware) for performing the functions ascribed herein to the host system 105, memory system controller 115, memory device 130, or memory device 140. For example, such instructions, when executed by the host system 105 (e.g., by the host system controller 106), by the memory system controller 115, by a memory device 130 (e.g., by a local controller 135), or by a memory device 140 (e.g., by a local controller 145), may cause the host system 105, memory system controller 115, memory device 130, or memory device 140 to perform one or more associated functions as described herein.

Figure 2:
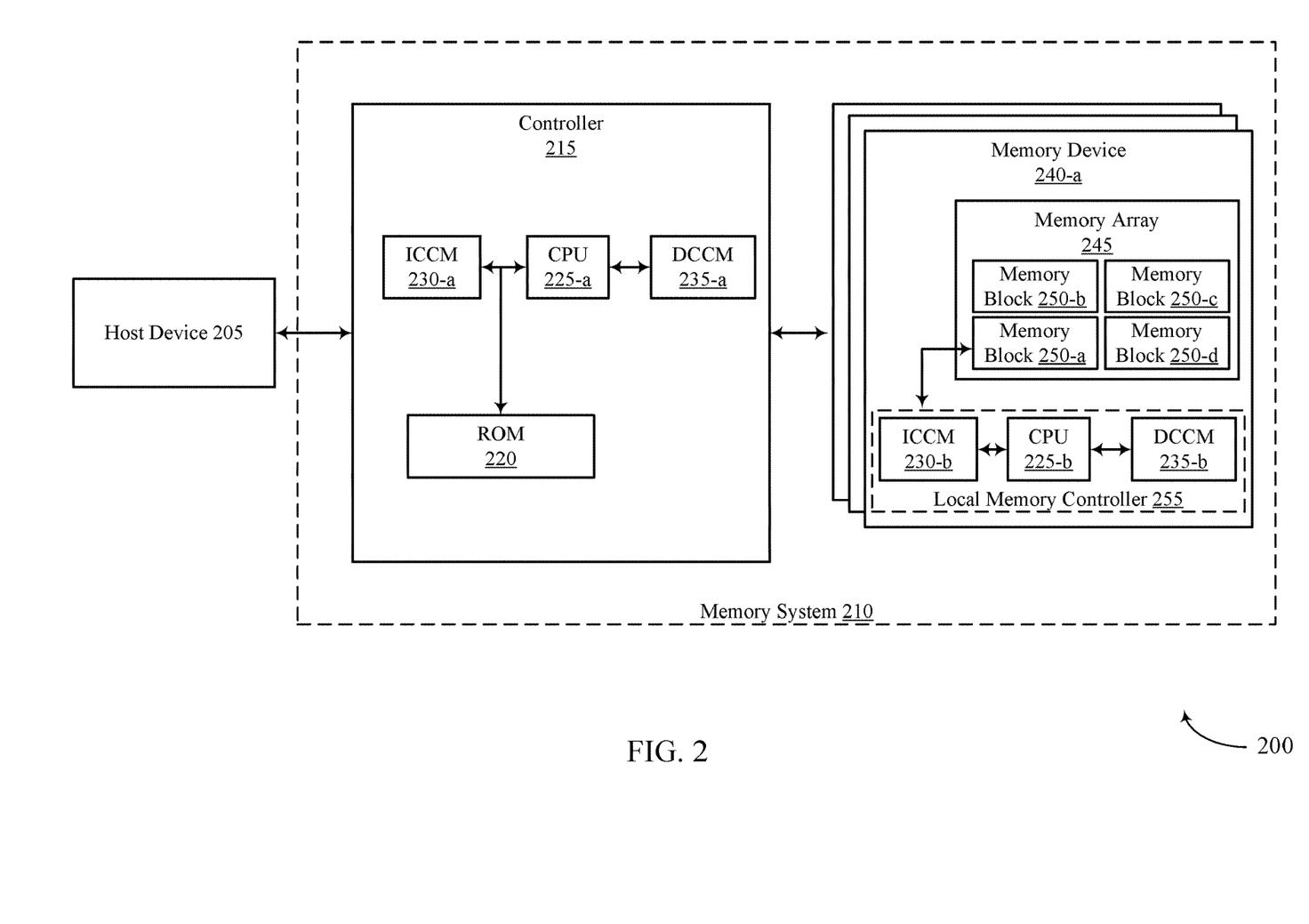
FIG. 2 illustrates an example of a block diagram that supports initialization techniques for memory devices in accordance with examples as disclosed herein.

FIG. 2 illustrates an example of a block diagram 200 that supports initialization techniques for memory devices in accordance with examples as disclosed herein. In some examples, the block diagram 200 may implement aspects of the system 100. For example, the block diagram 200 may include a memory system 210 coupled to a host device 205, which may be examples of a memory system 110 and a host system 105, respectively, as described with reference to FIG. 1.

The memory system 210 may include a controller 215, which may be an example of a memory system controller 115 as described with reference to FIG. 1. For example, the controller 215 may be an example of a MNAND controller that manages operations for one or more memory devices 240 (e.g., NAND memory devices), which may be examples of a memory device 130 or a memory device 140 as described with reference to FIG. 1. For example, the controller 215 may be coupled to the memory device 240-a and the host device 205.

The controller 215 may include one or more components. For example, the controller 215 may include a host interface for communications with the host device 205, a NAND interface to communicate with the memory device 240-a, an analog module, buffer memory, or any combination thereof, among other examples of components. Additionally or alternatively, the controller 215 may include a central processing unit (CPU) 225-a, ROM 220, instruction close coupled memory (ICCM) 230-a, data close coupled memory (DCCM) 235-a, or any combination thereof.

The memory device 240-a may be an example of NAND memory coupled to the controller 215. For example, the memory device 240-a may include a memory array 245 of memory blocks 250 (e.g., NAND memory cells). The memory device 240-a may include one or more modules, such as an analog module or a NAND interface for communications with the controller 215, among other examples of modules. The memory device 240-a may include a local memory controller 255, which may be an example of a local memory controller 135 or a local memory controller 145 as described herein with reference to FIG. 1. For example, the local memory controller 255 may include ICCM 230-b, a CPU 225-b, and DCCM 235-b. In some examples, the local memory controller 255 may be relatively smaller than the controller 215. As an illustrative example, the local memory controller 255 may use relatively smaller components than the controller 215 or may be configured with relatively less components than the controller 215 (e.g., the local memory controller 255 may be relatively simpler than the controller 215, for example, the local memory controller 255 may be configured to perform less complex or a smaller quantity of operations compared to the controller 215).

The techniques herein may provide for aspects of the fabrication of the memory system 210. For example, one or more dies may be formed as part of a fabrication process for the memory system 210. The memory array 245 may be formed on a first die (e.g., the memory device 240-a may be an example of the first die) and the controller 215 may be formed on a second die. The first die and the second die may be placed within a same package or module. In some examples, the fabrication process may include forming an interface between the first die and the second die, an interface between the second die for coupling with a host device 205, etc., among other examples of forming one or more modules or components as described herein.

The fabrication process may include forming ROM 220 on the second die. In such examples, forming the controller 215 may include encoding a first set of operating instructions for the controller 215 to the ROM 220. For example, the content of the ROM 220 may be encoded based on one or more masks used during the fabrication process (e.g., the first set of operating instructions may be encoded to the ROM 220 of the controller 215 based on the physical structure of one or more metal layers therein, with such physical structure based on one or more associated fabrication masks or other fabrication processes). In other words, the first set of operating instructions may be hardwired to the ROM 220.

Additionally, operating instructions for the controller 215 may be written to a memory block 250 of the memory array 245. For example, a second set of operating instructions may be written to the memory block 250-a as part of the fabrication process, after the fabrication process, or both. The first set of operating instructions may be configured to indicate a location of the second set of operating instructions. The second set of operating instructions may indicate a location of other operating instructions (e.g., additional memory blocks for firmware of the controller 215) and may be used to complete or at least further the completion of the initialization procedure at the controller 215. In some examples, the second set of operating instructions may be stored at a same block as initialization instructions for the local memory controller 255 (e.g., the memory block 250-a may store operating instructions for the local memory controller 255 and the second set of operating instructions for the controller 215). While referred to and illustrated as a single memory block 250-a, it is to be understood that memory block 250-a may in some cases correspond to multiple memory blocks 170, or some other grouping of memory cells within a memory array.

In some examples, the memory block 250-a may be configured to be inaccessible to a host device. As an illustrative example, the operating instructions stored at the memory block 250-a may correspond to one or more addresses outside of an address range accessible by the host device 205. In other words, the memory system 210 may include an address bus configured to receive commands from the host device 205 and the commands may be associated with an address space for the memory array 245 that does not include the memory block 250-a (e.g., the memory block 250-a may be outside of the address space accessible by the host device 205). The other memory blocks 250 (e.g., the memory block 250-b, 250-c, or 250-d) may be included in the address space (e.g., the other memory block 250 may be accessible by a host device 205). The memory block 250-a may be an example of a NAND OTP memory block 250 (e.g., the memory block 250-a may be the same physically as the other memory blocks 250 and the second set of operating instructions may be written as ROM for a host device and/or for the local memory controller 215).

In some examples, the memory block 250-a may be programmable using a test mode. For example, the memory system 210 may be configured (e.g., operated) in a test mode which may enable the memory block 250-a to be accessed, erased, reprogrammed, etc. (e.g., the NAND OTP block storing the second set of operating instructions may be reprogrammable, modifiable, or erasable when the memory system 210 is configured in the test mode and the memory block may be read-only when the memory system 210 is not configured in the test mode). Such a test mode may enable, for example, a manufacturer of the memory system 210 to modify the instructions stored at the memory block 250-a while ensuring that a user does not modify the bootstrap code.

Such a memory system 210 may result in improved modification of operating instructions for the controller 215 (e.g., to correct errors or implement updates), among other advantages. For example, the controller 215 may perform an initialization procedure (e.g., a bootstrap procedure) using operating instructions. As an illustrative example, the CPU 225-a may use the operating instructions (e.g., bootstrap code) to initialize the controller as part of starting up firmware for managing operations of the memory system 210. The controller 215 may read, as part of the initialization procedure, the first set of operating instructions from the ROM 220 (e.g., the first set of operating instructions hardwired to the ROM 220 during the fabrication of the controller 215). The controller 215 may identify the memory block 250-*a* storing the second set of operating instructions based on reading the first set of operating instructions. For example, the first set of operating instructions may indicate the location of the second set of operating instructions (e.g., the first set of operating instructions may include an indication of the memory block 250-*a* that includes the second set of operating instructions, such as a mapping or other examples of a correspondence between the second set of operating instructions and the memory block 250-*a*).

The controller 215 may obtain the second set of operating instructions from the memory device 240-*a*. For example, the controller 215 may send, to the local memory controller 255 (e.g., via a NAND interface), a command requesting data from the memory block 250-*a* (e.g., the second set of operating instructions). For example, the command may indicate an address of the second set of operating instructions in the memory block 250-*a*. The local memory controller 255 may read the second set of operating instructions from the memory block 250-*a* and send the second set of operating instructions to the controller 215 (e.g., via the NAND interface) in response to receiving the command. The controller 215 may complete or further the initialization procedure using the second set of operating instructions.

In some examples, the memory array 245 may include additional operating instructions (e.g. firmware) for managing operations of the memory device 240-*a* (e.g., managing post-initialization operations of the memory array 245). For example, the second set of operating instructions may indicate one or more additional memory blocks 250. The controller 215 may obtain (e.g., via the local memory controller 255) a third set of operating instructions for the controller 215 based on the second set of operating instructions. For instance, the third set of operating instructions may be stored at the one or more additional memory blocks and the local memory controller 255 may read the third set of operating instructions and send the instructions to the controller 215.

In some examples, the local memory controller 255 may perform an error correction or detection procedure for the operating instructions stored in the memory array 245 (e.g., the memory device 240-*a* may perform error correction locally, which may reduce a processing load of the CPU 225-*a*). In some examples, the memory system 210 may implement a redundancy scheme to ensure that the operating instructions do not contain errors. In such examples, the local memory controller 255 may store copies of the second set of operating instructions stored in the memory array 245. For example, the memory block 250-*a* may be configured to store a set of copies of the second set of operating instructions for the controller 215 (although the copies may be stored in any of the memory blocks 250). When retrieving the second set of operating instructions for the controller 215, the local memory controller 255 may read each of the set of copies. The local memory controller 255 may compare the copies and identify at least a subset of the copies as being identical copies (e.g., the local memory controller 255 may identify a majority of the copies that include the same data, and the local memory controller may determine that the data included in the majority of copies is the correct data). The local memory controller 255 may transfer the data associated with the subset of the copies to the controller 215 (e.g., the local memory controller 255 may send, via a NAND interface, one of the identical copies of the second set of operating instructions to the second die including the controller 215).

Additionally or alternatively, the memory system 210 may implement parity information for error correction or detection procedures. For example, the controller 215 may generate parity bits for the second set of operating instructions and store the parity bits on the die including the memory array 245 (e.g., the parity bits may be stored in the memory block 250-*a* or another memory block 250). The controller 215 perform error correction or detection using the parity bits. For example, the controller 215 may read the second set of operating instructions and compare the stored parity bits to a set of parity bits generated when reading the second set of operating instructions. If the controller 215 does not detect any errors, the received data can be considered valid. Alternatively, the controller 215 may correct one or more errors prior to using the received data and modify the memory block 250-*a* to store the corrected data.

By storing at least a portion of the operating instructions for the controller 215 in the memory array 245, the memory system 210 may realize one or more potential advantages. For example, the operating instructions stored at the memory device 240-*a* may be relatively flexible. That is, operating instructions stored at the memory device 240-*a* may be erasable, programmable, or re-programmable (e.g., in a test mode as described herein), which may facilitate relatively efficient error correction operations, firmware updates, or other examples of modifications to the operating instructions. For example, if an error is detected in the second set of operating instructions, the local memory controller 255 may correct the error and modify the second set of operating instructions at the memory block 250-*a* to store the corrected data. Such modifications may be performed, for example, without altering a fabrication mask (e.g., the operating instructions at the ROM 220 may be hardwired and may be relatively time and resource intensive to modify compared to the operating instructions in the memory array 245). As one example, if a bug is found in the operating instructions after or during the fabrication of the memory system 210, the memory system 210 may be enabled to correct the bug without altering a fabrication process for the ROM 220. Additionally or alternatively, the bootstrap code (e.g., the operating instructions) may be stored in a relatively fixed position (e.g., the memory block 250-*a* which may be inaccessible to a host device 205) and may not be remapped frequently, which may result in relatively low processing overhead and memory utilization for storing the firmware for the controller 215, among other benefits.

Figure 3:
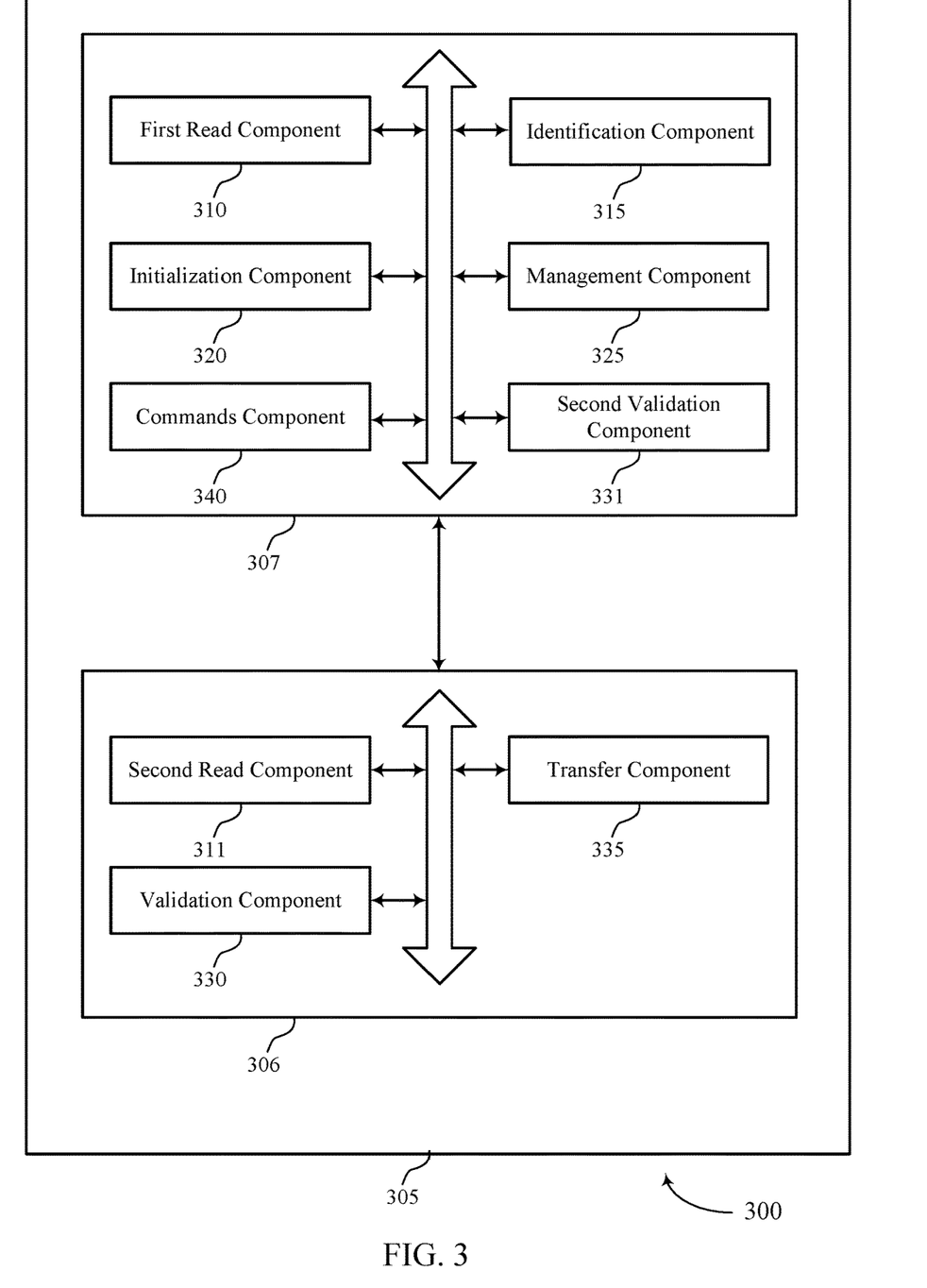
FIG. 3 shows a block diagram of a memory device that supports initialization techniques for memory devices in accordance with aspects of the present disclosure.

FIG. 3 shows a block diagram 300 of a memory device 305 (e.g., a memory system such as an MNAND device) that supports initialization techniques for memory devices in accordance with examples as disclosed herein. The memory device 305 may be an example of aspects of a memory device or a memory system as described with reference to FIGS. 1 and 2. For example, the memory device 305 may include a first die 306 (e.g., including a memory array and a local memory controller) and a second die 307 (e.g., including read only memory and a memory system controller), which may be examples of the various components as described herein. For example, the first die 306 and the second die 307 may communicate via a NAND interface as described with reference to FIG. 2.

The memory device 305 may include a first read component 310, a second read component 311, an identification component 315, an initialization component 320, a management component 325, a validation component 330, a second validation component 331, a transfer component 335, and a commands component 340. Each of these modules may communicate, directly or indirectly, with one another (e.g., via one or more buses). For example, the first die 306 may include the second read component 311, the validation component 330, and the transfer component 335. The second die 307 may include the first read component 310, the identification component 315, the initialization component 320, and the management component 325, the second validation component 331, and the commands component 340. Although the various components of the block diagram 300 are shown for illustrative clarity as being located on the first die 306 or the second die 307, it is to be understood that some components may be removed, some components may be added, components on a die may additionally or alternatively be located on a different die, or any combination thereof.

The first read component 310 may read, as part of an initialization procedure for a controller on the second die 307 within the memory device 305, a first set of operating instructions for the controller from read-only memory on the second die 307. The identification component 315 may identify a memory block of a memory array on the first die 306 based on the first set of operating instructions. In some examples, the second read component 311 may read a second set of operating instructions for the controller from the memory block of the memory array based on the identifying. The initialization component 320 may complete the initialization procedure for the controller based on the second set of operating instructions read from the memory block of the memory array.

In some examples, the identification component 315 may identify one or more additional memory blocks of the memory array based on the second set of operating instructions. In some examples, the second read component 311 may read a third set of operating instructions for the controller from the one or more additional memory blocks. The management component 325 may manage operation of the memory array based on the third set of operating instructions.

In some examples, the second read component 311 may read, as part of an initialization procedure for a second controller on the first die 306, a set of operating instructions for the second controller from the memory block of the memory array.

In some examples, the second read component 311 may read a set of copies of the second set of operating instructions from the memory block of the memory array. The validation component 330 may identify at least a subset of the set of copies as being identical copies of the second set of operating instructions. The transfer component 335 may transfer one of the identical copies of the second set of operating instructions from the first die 306 to the second die 307.

In some cases, the memory block of the memory array is configured to be programmable when the memory device is configured in a test mode and read-only when the memory device is not configured in the test mode. In some cases, the memory block of the memory array is configured to be inaccessible to a host device for the memory device. In some cases, the memory block of the memory array is configured to be read-only memory for a host device for the memory device. In some cases, the memory block of the memory array comprises NAND memory cells.

The commands component 340 may receive, at an address bus of the memory device and from a host device, commands associated with addresses within an address space for the memory array, where the memory block of the memory array is outside the address space.

In some cases, the read-only memory is configured to store the first set of operating instructions based on a fabrication mask for the second die 307. In some cases, the read-only memory on the second die 307 is not reprogrammable. In some cases, the memory block is configured to be erasable, modifiable, or both, by a controller on the second die 307 when the apparatus is configured in the test mode.

In some examples, the first read component 310 may read, from the memory block of the memory array, parity information for the second set of operating instructions. The second validation component 331 may detect an error in the second set of operating instructions based on the parity information read from the memory block of the memory array. In some examples, the second validation component 331 may correct the detected error in the second set of operating instructions based on the parity information.

Figure 4:
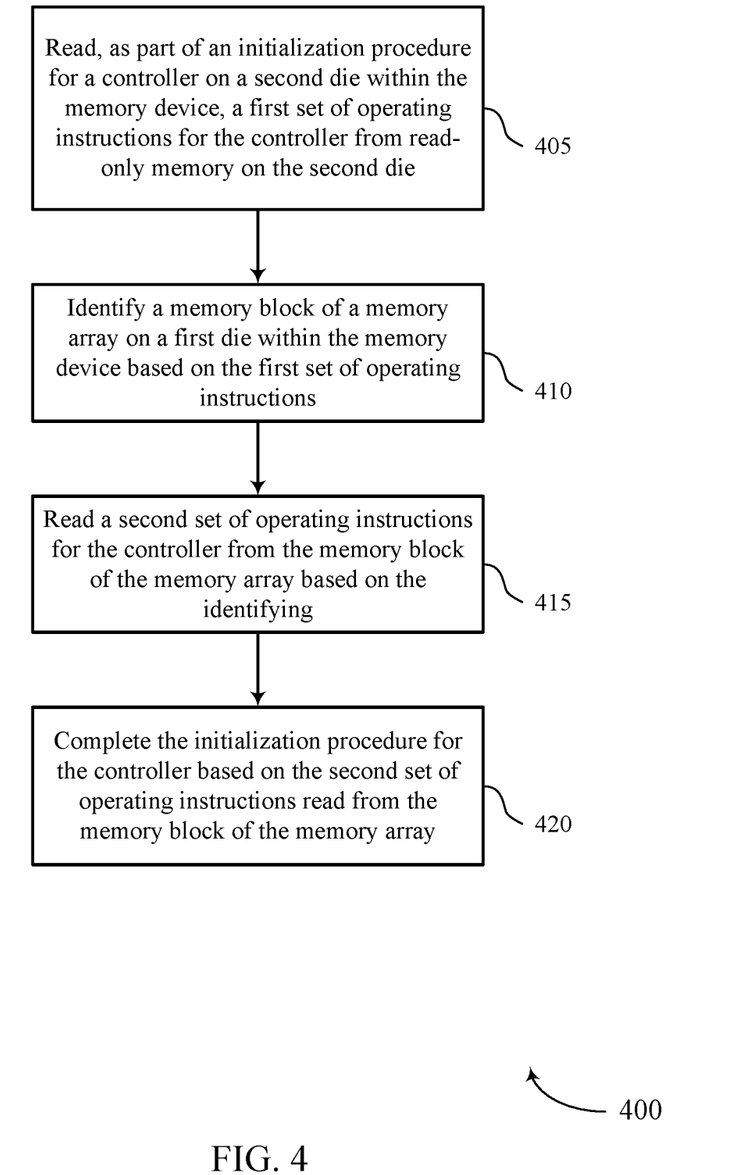
FIGS. 4 and 5 show flowcharts illustrating a method or methods that support initialization techniques for memory devices in accordance with examples as disclosed herein.

FIG. 4 shows a flowchart illustrating a method or methods 400 that supports initialization techniques for memory devices in accordance with aspects of the present disclosure. The operations of method 400 may be implemented by a memory device or its components as described herein. For example, the operations of method 400 may be performed by a memory device as described with reference to FIG. 3. In some examples, a memory device may execute a set of instructions to control the functional elements of the memory device to perform the described functions. Additionally or alternatively, a memory device may perform aspects of the described functions using special-purpose hardware.

At 405, the memory device may read, as part of an initialization procedure for a controller on a second die within the memory device, a first set of operating instructions for the controller from read-only memory on the second die. The operations of 405 may be performed according to the methods described herein. In some examples, aspects of the operations of 405 may be performed by a first read component as described with reference to FIG. 3.

At 410, the memory device may identify a memory block of a memory array on a first die within the memory device based on the first set of operating instructions. The operations of 410 may be performed according to the methods described herein. In some examples, aspects of the operations of 410 may be performed by an identification component as described with reference to FIG. 3.

At 415, the memory device may read a second set of operating instructions for the controller from the memory block of the memory array based on the identifying. The operations of 415 may be performed according to the methods described herein. In some examples, aspects of the operations of 415 may be performed by a second read component as described with reference to FIG. 3.

At 420, the memory device may complete the initialization procedure for the controller based on the second set of operating instructions read from the memory block of the memory array. The operations of 420 may be performed according to the methods described herein. In some examples, aspects of the operations of 420 may be performed by an initialization component as described with reference to FIG. 3.

In some examples, an apparatus as described herein may perform a method or methods, such as the method 400. The apparatus may include features for reading, as part of an initialization procedure for a controller on a second die within the memory device, a first set of operating instructions for the controller from read-only memory on the second die, identifying a memory block of a memory array on a first die within the memory device based on the first set of operating instructions, reading a second set of operating instructions for the controller from the memory block of the memory array based on the identifying, and completing the initialization procedure for the controller based on the second set of operating instructions read from the memory block of the memory array.

Some examples of the method 400 and the apparatus described herein may further include operations or features for identifying one or more additional memory blocks of the memory array based on the second set of operating instructions, reading a third set of operating instructions for the controller from the one or more additional memory blocks, and managing operation of the memory array based on the third set of operating instructions.

Some examples of the method 400 and the apparatus described herein may further include operations or features for reading, as part of an initialization procedure for a second controller on the first die, a set of operating instructions for the second controller from the memory block of the memory array.

In some examples of the method 400 and the apparatus described herein, the memory block stores a set of copies of the second set of operating instructions for the controller, and operations or features for reading the second set of operating instructions further may include operations or features for reading the set of copies of the second set of operating instructions from the memory block of the memory array, identifying at least a subset of the set of copies as being identical copies of the second set of operating instructions, and transferring one of the identical copies of the second set of operating instructions from the first die to the second die.

In some examples of the method 400 and the apparatus described herein, the memory block of the memory array may be configured to be programmable when the memory device is configured (e.g., operated) in a test mode and read-only when the memory device is not configured (e.g., operated) in the test mode.

In some examples of the method 400 and the apparatus described herein, the memory block of the memory array may be configured to be inaccessible to a host device for the memory device.

In some examples of the method 400 and the apparatus described herein, the memory block of the memory array may be configured to be read-only memory for a host device for the memory device.

Some examples of the method 400 and the apparatus described herein may further include operations or features for receiving, at an address bus of the memory device and from a host device, commands associated with addresses within an address space for the memory array, where the memory block of the memory array may be outside the address space.

In some examples of the method 400 and the apparatus described herein, the read-only memory may be configured to store the first set of operating instructions based on a fabrication mask for the second die.

In some examples of the method 400 and the apparatus described herein, the read-only memory on the second die may be not reprogrammable.

In some examples of the method 400 and the apparatus described herein, the memory block of the memory array may be configured to be programmable (e.g., erasable, modifiable, or both) when the memory device is configured (e.g., operated) in a test mode and the memory block may be configured to be read-only when the memory device is not configured (e.g., operated) in the test mode.

Some examples of the method 400 and the apparatus described herein may further include operations or features for reading, from the memory block of the memory array, parity information for the second set of operating instructions, detecting an error in the second set of operating instructions based on the parity information read from the memory block of the memory array, and correcting the detected error in the second set of operating instructions based on the parity information.

In some examples of the method 400 and the apparatus described herein, the memory block of the memory array may comprise NAND memory cells.

Figure 5:
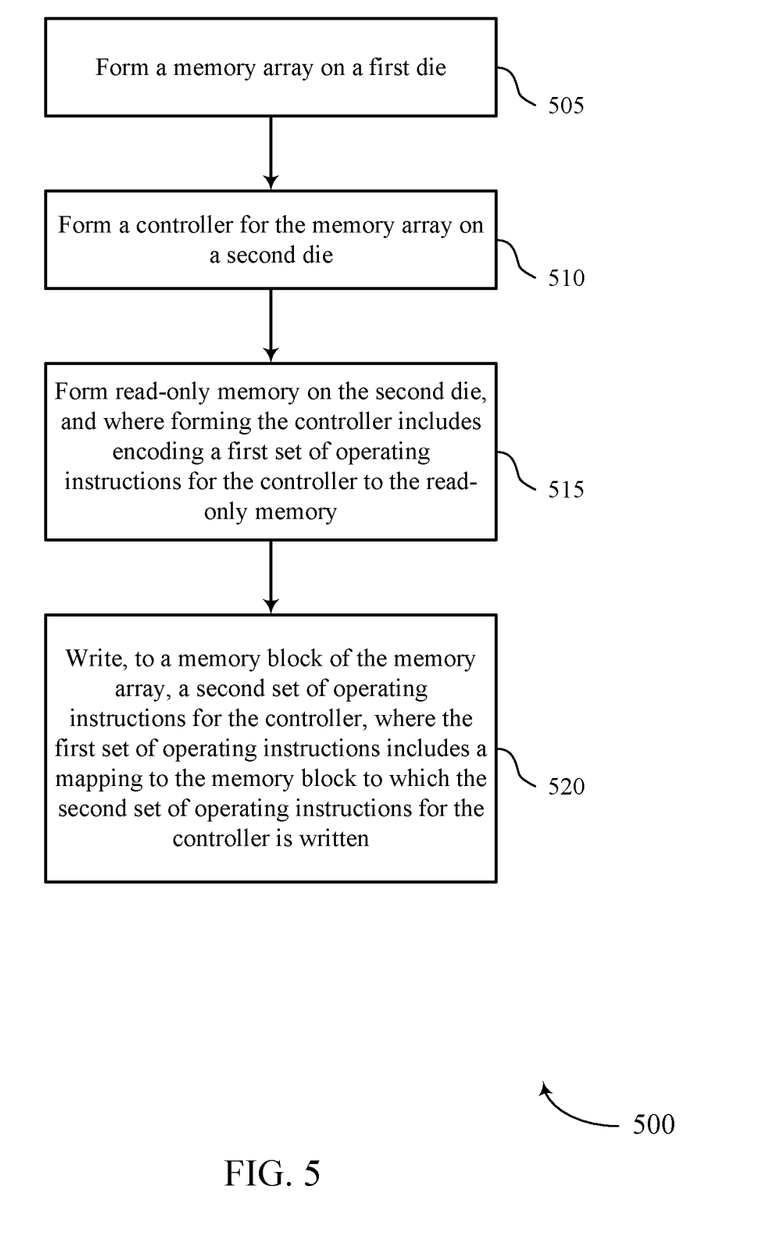

FIG. 5 shows a flowchart illustrating a method or methods 500 that supports initialization techniques for memory devices in accordance with aspects of the present disclosure. The operations of method 500 may be implemented by fabrication equipment for a memory device.

At 505, the fabrication equipment may form a memory array on a first die. The operations of 505 may be performed according to the methods described herein.

At 510, the fabrication equipment may form a controller for the memory array on a second die. The operations of 510 may be performed according to the methods described herein.

At 515, the fabrication equipment may form read-only memory on the second die, where forming the controller may include encoding a first set of operating instructions for the controller to the read-only memory. The operations of 515 may be performed according to the methods described herein.

At 520, the fabrication equipment may write, to a memory block of the memory array, a second set of operating instructions for the controller, where the first set of operating instructions may include a mapping to the memory block to which the second set of operating instructions for the controller is written. The operations of 520 may be performed according to the methods described herein.

In some examples, an apparatus as described herein may perform a method or methods, such as the method 500. The apparatus may include features for forming a memory array on a first die, forming a controller for the memory array on a second die, forming read-only memory on the second die, where forming the controller may include encoding a first set of operating instructions for the controller to the read-only memory, and writing, to a memory block of the memory array, a second set of operating instructions for the controller, where the first set of operating instructions may include a mapping to the memory block to which the second set of operating instructions for the controller is written.

Some examples of the method 500 and the apparatus described herein may further include operations or features for forming a second controller for the memory array on the first die, and writing, to the memory block of the memory array, a set of operating instructions for the second controller.

Some examples of the method 500 and the apparatus described herein may further include operations or features for writing, to the memory block of the memory array, a copy of the second set of operating instructions for the controller.

Some examples of the method 500 and the apparatus described herein may further include operations or features for encoding, to the memory block of the memory array, parity information for the second set of operating instructions.

Some examples of the method 500 and the apparatus described herein may further include operations or features for forming an interface between the first die and the second die, where the controller may be configured to receive the second set of operating instructions for the controller from the first die via the interface.

Some examples of the method 500 and the apparatus described herein may further include operations or features for placing the first die and the second die into a same package or module.

In some examples of the method 500 and the apparatus described herein, the second die may be configured to be couplable with a host device, and the read-only memory on the second die may be configured to be inaccessible to the host device.

Some examples of the method 500 and the apparatus described herein may further include operations or features for forming an interface between the first die and the second die, where the second die may be configured to be couplable with a host device, where the memory block to which the second set of operating instructions may be written may be configured to be inaccessible to the host device, and where a second memory block of the memory array may be configured to be accessible to the host device.

Some examples of the method 500 and the apparatus described herein may further include operations or features for operating the memory array in accordance with a test mode, erasing, based on operating the memory array in accordance with the test mode, a prior version of the second set of operating instructions from the memory block of the memory array, and writing, to the memory block or a second memory block of the memory array, the second set of operating instructions.

It should be noted that the methods described above describe possible implementations, and that the operations and the steps may be rearranged or otherwise modified and that other implementations are possible. Further, portions from two or more of the methods may be combined.

An apparatus is described. The apparatus may include a memory array on a first die and a controller on a second die, where the second die is coupled with the first die, and where the controller is configured to cause the apparatus to read, as part of an initialization procedure for the controller, a first set of operating instructions for the controller from read-only memory on the second die, identify a memory block of the memory array based on the first set of operating instructions, read a second set of operating instructions for the controller from the memory block of the memory array based on the identifying, and complete the initialization procedure for the controller based on the second set of operating instructions read from the memory block of the memory array.

In some examples, the controller may be further configured to cause the apparatus to identify one or more additional memory blocks of the memory array based on the second set of operating instructions, read a third set of operating instructions for the controller from the one or more additional memory blocks, and manage operation of the memory array based on the third set of operating instructions.

Some examples of the apparatus may include a second controller on the first die and coupled with the memory array, where the second controller may be configured to cause the apparatus to read, as part of an initialization procedure for the second controller, a set of operating instructions for the second controller from the memory block of the memory array.

In some examples, the memory block may be configured to store a plurality of copies of the second set of operating instructions for the controller, and, to read the second set of operating instructions for the controller from the memory block of the memory array, the second controller may be configured to cause the apparatus to read the set of copies of the second set of operating instructions from the memory block of the memory array, identify at least a subset of the set of copies as being identical copies of the second set of operating instructions, and transfer one of the identical copies of the second set of operating instructions from the first die to the second die.

In some examples, the memory block of the memory array may be configured to be programmable when the apparatus is configured (e.g., operated) in a test mode and read-only when the apparatus is not configured (e.g., operated) in the test mode.

In some examples, the memory block of the memory array may be configured to be inaccessible to a host device for the apparatus.

In some examples, the memory block of the memory array may be configured to be read-only memory for a host device for the apparatus.

Some examples of the apparatus may include an address bus configured to receive, from a host device for the apparatus, commands associated with addresses within an address space for the memory array, where the memory block of the memory array may be outside the address space.

In some examples, the read-only memory may be configured to store the first set of operating instructions based on a fabrication mask for the second die.

In some examples, the read-only memory on the second die may be not reprogrammable.

In some examples, the memory block may be configured to be erasable, modifiable, or both, by the controller when (e.g., only when) the apparatus is configured in a test mode.

In some examples, the controller may be further configured to cause the apparatus to read, from the memory block of the memory array, parity information for the second set of operating instructions, detect an error in the second set of operating instructions based on the parity information read from the memory block of the memory array, and correct the detected error in the second set of operating instructions based on the parity information.

In some examples, the memory block of the memory array may include NAND memory cells.

An apparatus is described. The apparatus may include a first die including a memory array, where the memory array includes a set of memory blocks, and a second die coupled with the first die, where the second die includes a controller for the memory array. Read-only memory on the second die may be configured to store a first set of operating instructions for the controller, a memory block of the memory array on the first die may be configured to store a second set of operating instructions for the controller, and the first set of operating instructions may be configured to indicate the memory block of the memory array on the first die that is configured to store the second set of operating instructions for the controller.

Some examples of the apparatus may include an interface between the first die and the second die, where the controller on the second die may be configured to receive the second set of operating instructions for the controller from the first die via the interface.

Some examples of the apparatus may include a second controller on the first die and coupled with the memory array, where the memory block that is configured to store the second set of operating instructions for the controller is also configured to store a set of operating instructions for the second controller.

An apparatus is described. The apparatus may include a first die coupled with a second die within a package or module, a memory array on the first die, read-only memory on the second die, and a controller on the second die for the memory array. The read-only memory on the second die may be configured to store a first set of operating instructions for an initialization procedure of the controller, and the memory array may include a memory block configured to store a second set of operating instructions for the initialization procedure of the controller.

Some examples of the apparatus may further include a second controller on the first die for the memory array, where the memory block may be further configured to store a set of operating instructions for a second initialization procedure of the second controller.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals are capable of being communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

The term "layer" or "level" used herein refers to a stratum or sheet of a geometrical structure (e.g., relative to a substrate). Each layer or level may have three dimensions (e.g., height, width, and depth) and may cover at least a portion of a surface. For example, a layer or level may be a three dimensional structure where two dimensions are greater than a third, e.g., a thin-film. Layers or levels may include different elements, components, and/or materials. In some examples, one layer or level may be composed of two or more sublayers or sublevels.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. An apparatus, comprising:
a memory array on a first die; and
a controller on a second die, wherein the controller is configured to cause the apparatus to:
read, as part of an initialization procedure for the controller, a first set of operating instructions for the controller from memory on the second die;
read, based at least in part on the first set of operating instructions, a second set of operating instructions for the controller from a memory block of the memory array on the first die; and
complete the initialization procedure for the controller based at least in part on the second set of operating instructions.

2. The apparatus of claim 1, further comprising:
a second controller on the first die, wherein the second controller is configured to cause the apparatus to:
read, as part of an initialization procedure for the second controller, a set of operating instructions for the second controller from the memory block of the memory array.

3. The apparatus of claim 1, wherein the controller is further configured to cause the apparatus to:
send, to a second controller on the first die, a command requesting data from the memory block of the memory array on the first die; and
receive, from the second controller, the second set of operating instructions based at least in part on sending the command, wherein completing the initialization procedure is based at least in part on receiving the second set of operating instructions from the second controller.

4. The apparatus of claim 1, further comprising:
a second controller on the first die, wherein the second controller is configured to cause the apparatus to read the second set of operating instructions from the memory block of the memory array.

5. The apparatus of claim 1, wherein the first set of operating instructions indicates the memory block of the memory array on the first die.

6. The apparatus of claim 1, wherein the controller is further configured to cause the apparatus to:
read a third set of operating instructions for the controller from one or more additional memory blocks of the memory array based at least in part on the second set of operating instructions indicating the one or more additional memory blocks; and
manage operation of the memory array based at least in part on the third set of operating instructions.

7. The apparatus of claim 1, wherein the memory block is configured to store a plurality of copies of the second set of operating instructions for the controller, and wherein, to read the second set of operating instructions for the controller from the memory block of the memory array, a second controller is configured to cause the apparatus to:
read the plurality of copies of the second set of operating instructions from the memory block of the memory array;
identify at least a subset of the plurality of copies as being identical copies of the second set of operating instructions; and
transfer one of the identical copies of the second set of operating instructions from the first die to the second die.

8. The apparatus of claim 1, further comprising:
an address bus configured to receive, from a host device for the apparatus, commands associated with addresses within an address space for the memory array, wherein the memory block of the memory array is outside the address space.

9. The apparatus of claim 1, wherein the controller is further configured to cause the apparatus to:
read, from the memory block of the memory array, parity information for the second set of operating instructions;

detect an error in the second set of operating instructions based at least in part on the parity information read from the memory block of the memory array; and correct the detected error in the second set of operating instructions based at least in part on the parity information.

10. A method performed by a memory device, the method comprising:

reading, as part of an initialization procedure for a controller on a second die within the memory device, a first set of operating instructions for the controller from memory on the second die;

reading, based at least in part on the first set of operating instructions, a second set of operating instructions for the controller from a memory block of a memory array on a first die within the memory device; and completing the initialization procedure for the controller based at least in part on the second set of operating instructions.

11. The method of claim 10, further comprising:

reading, as part of an initialization procedure for a second controller on the first die, a set of operating instructions for the second controller from the memory block of the memory array.

12. The method of claim 11, further comprising:

transmitting, to the second controller, a command requesting data from the memory block of the memory array on the first die, wherein reading the second set of operating instructions from the memory block is based at least in part on the command; and receiving, from the second controller, the second set of operating instructions based at least in part on the command.

13. The method of claim 12, wherein receiving the second set of operating instructions from the second controller is based at least in part on the second controller reading the second set of operating instructions from the memory block of the memory array based at least in part on the second controller receiving the command.

14. The method of claim 13, wherein receiving the second set of operating instructions from the second controller is based at least in part on the second controller transmitting the second set of operating instructions to the controller, and wherein transmitting the second set of operating instructions is based at least in part on the second controller reading the second set of operating instructions from the memory block of the memory array.

15. The method of claim 10, further comprising:

reading a third set of operating instructions for the controller from one or more additional memory blocks of the memory array based at least in part on the second set of operating instructions; and managing operation of the memory array based at least in part on the third set of operating instructions.

16. The method of claim 10, wherein the memory block stores a plurality of copies of the second set of operating instructions for the controller, and wherein reading the second set of operating instructions further comprises:

reading the plurality of copies of the second set of operating instructions from the memory block of the memory array;

identifying at least a subset of the plurality of copies as being identical copies of the second set of operating instructions; and transferring one of the identical copies of the second set of operating instructions from the first die to the second die.

17. The method of claim 10, further comprising:

reading, from the memory block of the memory array, parity information for the second set of operating instructions;

detecting an error in the second set of operating instructions based at least in part on the parity information read from the memory block of the memory array; and correcting the detected error in the second set of operating instructions based at least in part on the parity information.

18. An apparatus, comprising:

a first die comprising a memory array, wherein the memory array comprises a plurality of memory blocks; and a second die that comprises a controller for the memory array, wherein:

memory on the second die is configured to store a first set of operating instructions for the controller; and a memory array on the first die is configured to store a second set of operating instructions for the controller.

19. The apparatus of claim 18, further comprising:

an interface between the first die and the second die, wherein the controller on the second die is configured to receive the second set of operating instructions for the controller from the first die via the interface.

20. The apparatus of claim 18, further comprising:

a second controller on the first die and coupled with the memory array, wherein the memory array that is configured to store the second set of operating instructions for the controller is also configured to store a set of operating instructions for the second controller.

* * * * *